United States Patent [19]

Takiguchi et al.

[11] Patent Number: 4,819,240

[45] Date of Patent: Apr. 4, 1989

[54] LIGHT MODULATOR

[75] Inventors: Haruhisa Takiguchi; Shinji Kaneiwa, both of Nara; Toshihiko Yoshida; Sadayoshi Matsui, both of Tenri, all of Japan

[73] Assignee: Sharp Kabushiki Kaisha, Osaka, Japan

[21] Appl. No.: 180,637

[22] Filed: Apr. 7, 1988

Related U.S. Application Data

[63] Continuation of Ser. No. 879,635, Jun. 27, 1986, abandoned.

[30] Foreign Application Priority Data

Jun. 28, 1985 [JP] Japan .................... 60-143687

[51] Int. Cl.$^4$ .............................. H01S 3/10
[52] U.S. Cl. ............................ 372/26; 372/28; 372/29; 372/38
[58] Field of Search ............... 372/26, 27, 28, 29, 372/30, 31, 32, 38

[56] References Cited

U.S. PATENT DOCUMENTS 3,617,932  11/1971  Paoli ........................ 372/25
3,663,897  5/1972  Broom ........................ 372/20

FOREIGN PATENT DOCUMENTS 1101923  5/1981  Canada ........................ 372/38
508999  7/1971  Fed. Rep. of Germany .
2550645  6/1984  France .
59-129948  7/1984  Japan .
0065590  4/1985  Japan ........................ 372/32
0064485  4/1985  Japan ........................ 372/32

OTHER PUBLICATIONS

"Speckle Noise Reduction in Fiber Optic Analog Video Transmission Using Semiconductor Laser Diodes", Ken-Ichi Sato et al, IEEE Transactions on Communications, vol. COM-29, No. 7, Jul. 1981.

Primary Examiner—William L. Sikes
Assistant Examiner—Georgia Y. Epps
Attorney, Agent, or Firm—Birch, Stewart, Kolasch & Birch

[57] ABSTRACT

A light modulator for modulating data signal to high frequency light signal includes a semiconductor laser diode having an input for receiving the data signal and an output for producing a laser beam, a light detector for receiving the laser beam and producing an electric signal representing the laser beam, and an electric passage between the light detector and the input of the semiconductor laser diode so as to define a positive feedback circuit for feeding the output of the semiconductor laser diode to the input of the same, whereby an oscillation at a resonance frequency is effected in the semiconductor laser diode to generate a light modulated high frequency laser signal from the semiconductor laser diode.

5 Claims, 1 Drawing Sheet

LIGHT MODULATOR

This application is a continuation of application Ser. No. 879,635 filed on June 27, 1986, now abandoned.

BACKGROUND OF THE INVENTION

1. Field of the invention

The present invention relates to a light modulator and, more particularly, to a modulator using a semiconductor laser diode.

2. Description of the Prior Art

It is known in the art to use semiconductor diodes for transmission systems, such as video signal transmission systems. Such a transmission system is generally referred to as an optical transmission system. Although the optical transmission system has advantages in wide modulation bandwidth and high coupling efficiency, it also has the following problems.

First, speckles in optical fibers, generated by the interference among propagating modes in the optical fibers due to the change in the coupling coefficient at junctions of optical fibers, adversely affect the linearity of the signal propagation, resulting in the generation of noise signals which are generally called speckle noise.

Another problem is the laser diode linearity deterioration caused by the light reflected back to the laser from the optical fiber at the coupler, resulting in the generation of unwanted reflection noise signals.

To reduce such noise signals, the signal to be transmitted is superimposed by a high frequency carrier (about 1 GHz). When such a high frequency signal is applied to a semiconductor laser diode, the laser diode performs a multilongitudinal mode oscillation, thereby widening the oscillation spectral width. This results in chirping, i.e., the undesirable variation of wavelength of the laser generated from the laser diode, and also results in the reduction of the coherence of the laser. This is further disclosed in an article "Speckle Noise Reduction in Fiber Optic Analog Video Transmission Using Semiconductor Laser Diodes" by Sato et al presented in IEEE TRANSACTIONS ON COMMUNICATIONS, Vol. COM-29, No. 7. July 1981, pages 1017-1024.

An example of a prior art light modulator is shown in FIG. 1 in which a data signal generator 2 generates a data signal to be modulated, such as a video signal. The data signal from generator 2 is superimposed on a high frequency carrier signal provided from high frequency signal generator 3 through capacitor 4. The superimposed signal is applied to semiconductor laser diode 1 at which the light modulation is carried out.

The prior art light modulator has the following disadvantages. Since the semiconductor laser diode has a relatively large value of coupling capacitance, the total capacitance of the light modulator amouonts to a large value, resulting in high power of high frequency signal on which the data signal is superimposed. Therefore, it is necessary to prepare a high frequency signal generator 3 which is capable of producing a high power output, resulting in a high manufacturing cost. Also, such a high power output accompanies unwanted electromagnetic wave emission which enhances the noise signal.

SUMMARY OF THE INVENTION

The present invention has been developed with a view to substantially solving the above described disadvantages and has for its essential object to provide an improved light modulator which can operate at a low power and can be manufactured at low cost.

It is also an essential object of the present invention to provide a light modulator which can produce a light modulated signal with less noise signals.

In accomplishing these and other objects, a light modulator for modulating data signal to high frequency light signal according to the present invention comprises a semiconductor laser diode having an input for receiving the data signal and an output for producing laser, a light detector for receiving the laser and producing an electric signal representing the laser, and an electric passage between the light detector and the input of the semiconductor laser diode so as to define a positive feedback circuit for feeding the output of the semiconductor laser diode to the input of the same, whereby an oscillation at a resonance frequency is effected in the semiconductor laser diode to generate a light modulated high frequency laser signal from the semiconductor laser diode.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Before the description proceeds to the preferred embodiment of the present invention, the output characteristic of a semiconductor laser diode is explained in connection with FIG. 2.

Figure 1:
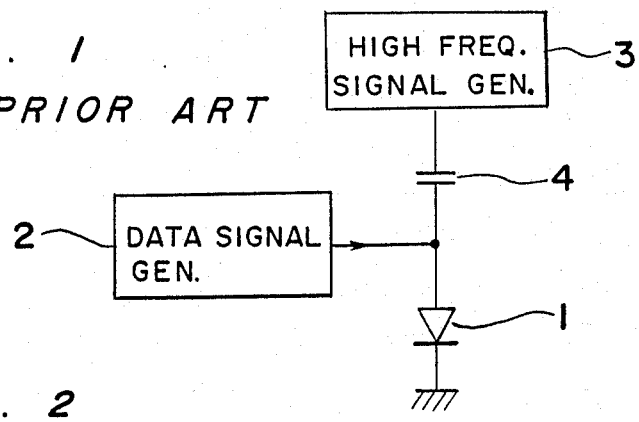
FIG. 1 is a circuit diagram of a light modulator of the prior art.
Figure 2:
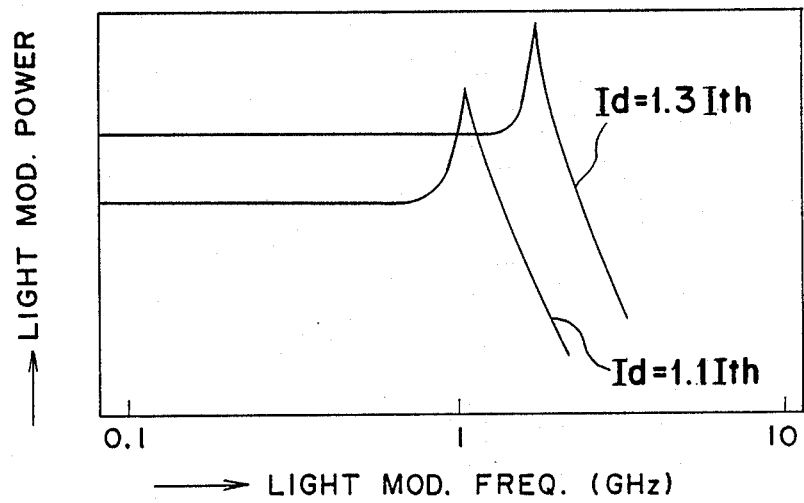
FIG. 2 is a graph showing a relationship between the light modulation frequency and the light modulation output power of a semiconductor laser diode.

As shown in FIG. 2, the output characteristic of a semiconductor laser diode used for the light modulation varies with respect to the driving current Id. The graph in FIG. 2 shows two different cases;

Id = 1.3 Ith and Id = 1.1 Ith, in which Ith is a threshold current of the oscillation. Also, the resonance frequency Fr exists near and on the low frequency side of the cutoff frequency of the semiconductor laser diode, and it can be given by the following equation (1)

$$Fr \approx \left(\frac{1}{2\pi}\right)\frac{1}{\sqrt{\tau p \cdot \tau s}} \times \sqrt{\left(\frac{Id}{Ith} - 1\right)} \quad (1)$$

wherein $\tau p$ is a photon lifetime and $\tau s$ is a carrier lifetime.

If the light modulation is carried out at the resonance frequency, a high output power can be obtained with a small driving current. Therefore, the analog form data signal, which has been DC biased, may be used as the driving current Id for the light modulation. In this case, the resonance frequency Fr varies with respect to the change of the data signal. If the semiconductor laser diode can be driven at the resonance frequency Fr by some means, it is possible to carry out the light modulation at the minimum power consumption. The light modulator according to the present invention provides such means as described below.

Figure 3:
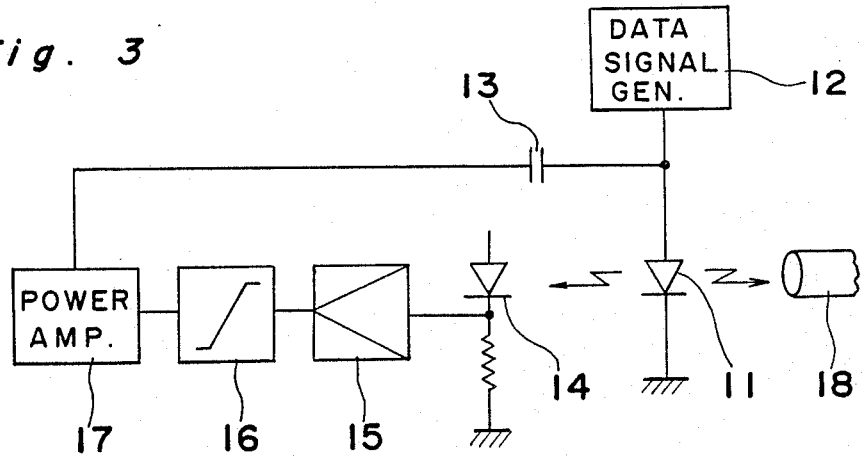
FIG. 3 is a circuit diagram of a light modulator according to one preferred embodiment of the present invention.

Referring to FIG. 3, the light modulator according to the present invention comprises a semiconductor laser diode 11 which is connected to a data signal generator 12 for generating analog data signal, such as a video signal, having a frequency ranging from 0 to about 500 MHz. Semiconductor laser diode 11 produces laser beams in opposite directions, one is directed to a light detector 14 and the other is directed to a light transmission line, such as an optical fiber 18 through a suitable converging lens (not shown). The output of light detector 14 is connected to a preamplifier 15 and further to a high pass filter 16 having a pass band of 800 MHz to 10 GHz. The output of high pass filter 16 is connected to a power amplifier 17 which is in turn connected through a capacitor 13 to the input of semiconductor laser diode 11, thereby defining a positive feedback circuit for the high frequency signal produced from the semiconductor laser doide driven under the multilongitudinal mode.

The operation of the light modulator of FIG. 3 will be described below.

The laser beam produced from laser diode 11 is detected by light detector 14 which then produces an electric signal corresponding to the laser beam signal. The electric signal from detector 14 is amplified by preamplifier 15 and is filtered at high pass filter 16 so as to cutoff the low frequency components. The filtered high frequency signal is amplified at amplifier 17 and is fed back through capacitor 13 to semiconductor laser diode 11. In this manner, the high frequency signal circulates in the positive feedback circuit so that the semiconductor laser diode 11 is applied with a high frequency driving current which effects the relaxation oscillation in the laser diode at resonance frequency. Therefore, semiconductor laser diode 11 makes a stable oscillation under the multilongitudinal mode with a minimum necessary power. Thus, the spectral width of oscillation is broadened and, at the same time, the laser coherence is reduced. Furthermore, the noise signals, particularly the reflection noise signals caused by the reflected light may be effectively reduced, thereby producing light modulated signal having very low S/N ratio.

According to the present invention, since the high frequency oscillation is effected in the semiconductor laser diode by the positive feedback circuit, the light modulation can be carried out in the semiconductor laser diode without employing any high frequency signal generator, separately. Therefore, the light modulator according to the present invention can be manufactured at low cost. Furthermore, since the oscillation can be done with a very low power, the light modulator can be operated with a simple power source.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claims.

What is claimed is:

1. A light modulator for modulating data signal to high frequency light signal, said light modulator comprising:
    a means for producing a data signal,
    a semiconductor laser diode having an input for receiving said data signal and an output for producing a laser beam;
    a light detector means for receiving said laser beam and producing an electric signal representing said laser beam;
    an electric passage means between said light detector means and said input of said semiconductor laser diode, said electric circuit means including a high pass filter,
    said semiconductor laser element, said light detector and said high pass filter constituting a high frequency feedback oscillator,
    said high frequency feedback oscillator effects an oscillation at a resonance frequency in said semiconductor laser diode to generate a light modulated high frequency laser signal from said semiconductor laser diode.

2. A light modulator as claimed in claim 1, wherein said electric circuit means further comprises a preamplifier connected between said light detector and said high pass filter.

3. A light modulator as claimed in claim 1, wherein said electric circuit means further comprises a power amplifier connected to an output of said high pass filter and to said input of said semiconductor laser diode.

4. A light modulator as claimed in claim 3, wherein said electric circuit means further comprises a capacitor connected between said power amplifier and said input of said semiconductor laser diode.

5. A light modulator as claimed in claim 1, wherein said high frequency feedback oscillator effects a multilongitudinal oscillation in said semiconductor laser diode.

* * * * *